United States Patent
Dietrich et al.

(10) Patent No.: US 9,243,341 B2
(45) Date of Patent: Jan. 26, 2016

(54) DEVICE AND METHOD FOR PRODUCING TARGETED FLOW AND CURRENT DENSITY PATTERNS IN A CHEMICAL AND/OR ELECTROLYTIC SURFACE TREATMENT

(75) Inventors: Lothar Dietrich, Werder (DE); Ralf Schmidt, Ahrensfelde (DE); Andreas Ostmann, Berlin (DE)

(73) Assignee: Fraunhofer-Gesellschaft zur Förderung der angewandten Forschung e. V. (DE)

( * ) Notice: Subject to any disclaimer, the term of this patent is extended or adjusted under 35 U.S.C. 154(b) by 359 days.

(21) Appl. No.: 13/812,975

(22) PCT Filed: Jul. 29, 2011

(86) PCT No.: PCT/EP2011/003859
§ 371 (c)(1),
(2), (4) Date: Apr. 11, 2013

(87) PCT Pub. No.: WO2012/013362
PCT Pub. Date: Feb. 2, 2012

(65) Prior Publication Data
US 2013/0186852 A1    Jul. 25, 2013

(30) Foreign Application Priority Data
Jul. 29, 2010 (DE) .......................... 10 2010 033 256

(51) Int. Cl.
*C25D 5/08* (2006.01)
*C25D 17/00* (2006.01)
(Continued)

(52) U.S. Cl.
CPC .............. *C25D 5/08* (2013.01); *C23C 18/1628* (2013.01); *C25D 5/02* (2013.01); *C25D 11/00* (2013.01);
(Continued)

(58) Field of Classification Search
CPC ........................................................ C25D 5/08
See application file for complete search history.

(56) References Cited

U.S. PATENT DOCUMENTS 4,119,516 A * 10/1978 Yamaguchi .............. C25D 5/08
   204/206
5,265,670 A * 11/1993 Zingher .................. F28F 13/02
   165/80.4
(Continued)

FOREIGN PATENT DOCUMENTS

DE      10140934 A1    2/2003
DE   102007026633 A1   12/2008
(Continued)

OTHER PUBLICATIONS

"International Application No. PCT/EP2011/003859, International Preliminary Report on Patentability mailed Feb. 7, 2013", 8 pgs.

(Continued)

*Primary Examiner* — Harry D Wilkins, III
(74) *Attorney, Agent, or Firm* — Schwegman Lundberg & Woessner, P.A.

(57) ABSTRACT

The invention relates to a device and method for producing targeted flow and current density patterns in a chemical and/or electrolytic surface treatment. The device comprises a flow distributor body which is disposed, with the front face thereof, plane-parallel to a substrate to be processed, and which has outlet openings on the front face, through which process solution flows onto the substrate surface. The process solution flowing back from the substrate is led off through connecting passages onto the rear face of the flow distributor body. At the same time a targeted distribution of an electrical field on a conductive substrate surface is effected by a specific arrangement of said connecting passages.

11 Claims, 3 Drawing Sheets

Figure 1:
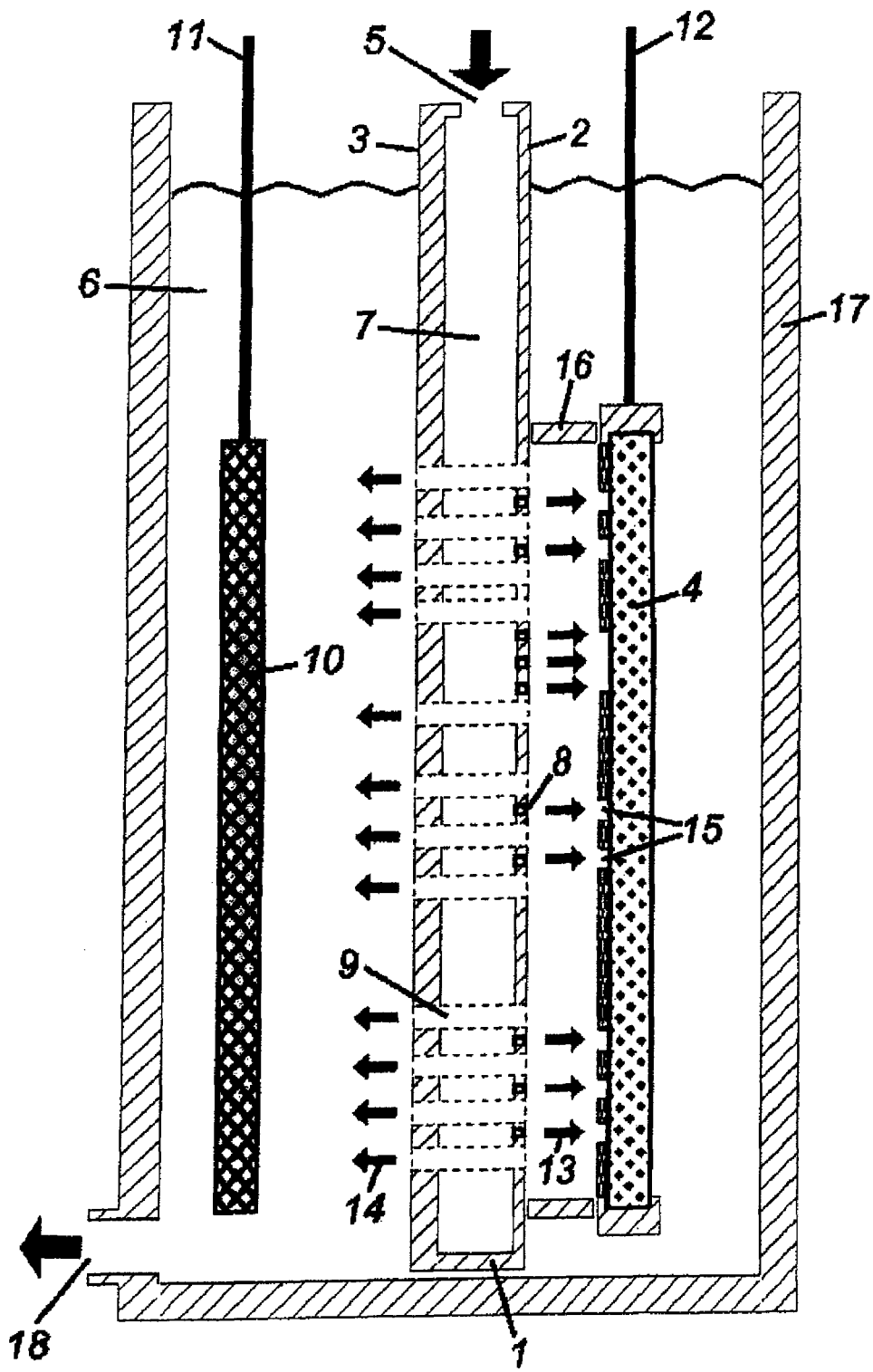

(51) Int. Cl.
*C25D 21/10* (2006.01)
*C23C 18/16* (2006.01)
*C25D 11/00* (2006.01)
*C25D 21/12* (2006.01)
*F17D 3/00* (2006.01)
*H01L 21/02* (2006.01)
*C25D 5/02* (2006.01)

(52) U.S. Cl.
CPC .............. *C25D 17/008* (2013.01); *C25D 21/12* (2013.01); *F17D 3/00* (2013.01); *H01L 21/02* (2013.01); *C25D 17/001* (2013.01); *Y10T 137/8593* (2015.04)

(56) References Cited

U.S. PATENT DOCUMENTS

| | | | |
|---|---|---|---|
| 6,132,586 A * | 10/2000 | Adams et al. | 205/123 |
| 6,440,295 B1 * | 8/2002 | Wang | 205/640 |
| 6,773,559 B2 * | 8/2004 | Woodruff et al. | 204/222 |
| 7,093,375 B2 * | 8/2006 | O'Donnell | 34/79 |
| 7,153,400 B2 * | 12/2006 | Ravkin et al. | 204/224 R |
| 7,578,923 B2 * | 8/2009 | Basol et al. | 205/663 |
| 8,128,461 B1 * | 3/2012 | O'Moore et al. | 451/41 |
| 8,277,602 B2 | 10/2012 | Dünnebeil et al. | |
| 8,545,687 B2 | 10/2013 | Schneider et al. | |
| 2002/0148732 A1 * | 10/2002 | Emesh et al. | 205/117 |
| 2004/0121708 A1 * | 6/2004 | Hu | B23H 5/06 451/41 |
| 2004/0217012 A1 | 11/2004 | Gramm | |
| 2004/0245112 A1 * | 12/2004 | Sekimoto | C25D 5/08 205/133 |
| 2006/0081478 A1 * | 4/2006 | Sahoda | C25D 5/08 205/148 |
| 2008/0251148 A1 | 10/2008 | Thie et al. | |

FOREIGN PATENT DOCUMENTS

| | | |
|---|---|---|
| DE | 102007026635 A1 | 12/2008 |
| WO | WO-03014424 A1 | 2/2003 |

OTHER PUBLICATIONS

"International Application No. PCT/EP2011/003859, International Search Report and Written Opinion mailed Oct. 21, 2011", 12 pgs.

* cited by examiner

DEVICE AND METHOD FOR PRODUCING TARGETED FLOW AND CURRENT DENSITY PATTERNS IN A CHEMICAL AND/OR ELECTROLYTIC SURFACE TREATMENT

PRIORITY CLAIM TO RELATED APPLICATION

This application is a national stage application under 35 U.S.C. §371 of PCT/EP2011/003859, filed Jul. 29, 2011, and published as WO 2012/013362 A1 on Feb. 2, 2012, which claims priority to German Application No. 10 2010 033 256.9, filed Jul. 29, 2010, which application and publication are incorporated by reference as if reproduced herein and made a part hereof in their entirety, and the benefit of priority of each of which is claimed herein.

The invention relates to a method for realizing locally defined liquid flows on approximately planar workpieces for the purpose of a controllable material transport of the entire surface thereof, as well as a device for the constructive realization of the method according to the invention. Simultaneously, the invention allows the targeted distribution of an electric field on a conductive substrate surface.

Devices and methods are suitable, in particular, for the processing of structured semi-conductor substrates, conductor plates, and film substrates, but also for processing of the entire surface of planar metal and metallized workpieces. Device and methods may also be used according to the invention for the production of large surface photoelectric panels for solar energy generation, or large-scale monitor panels.

In the surface treatments of substrates having liquid media, process speeds are applicably determined by the material transport by means of convection and diffusion due to a concentration gradient. If additionally a potential is applied from the exterior, the ion migration speed by means of migration is added. In a predetermined liquid, the transport activities to and from reaction educts and products within the diffusion layer therefore represent the steps determined by the speed. This applies to all processes, in which a sufficient liquid exchange is required at the treated surface of the workpieces, i.e. both to additive metallization techniques, and to subtractive etching techniques.

In particular with micro-structured substrates, as are found in conductor plate production, on in the semi-conductor treatment, the difficulty of use of higher incoming flow speeds and current densities with distribution to each surface element reacting with the process solution. The achievement of homogenous flow and current effects becomes more difficult with increasing substrate size and with uneven surface allocations.

Methods and devices for creating even flows in the substrate treatment are already known from prior art. Publication DE 10 2007 026633 B4 describes an incoming flow method for planar workpieces, wherein die liquid flows onto the entire surface by means of nozzles in an even manner without any design-dependent pattern, and the liquid is not locally returned, but flows off at the workpiece edge. For the electrolytic treatment, an insolubly perforated anode is present in this device between the incoming flow body and the substrate.

DE 10 2007 026635 A1 describes a flow method for planar workpieces, which creates a liquid movement that is even on the entire surface by means of the paddle-like body, wherein no anode is present due to a galvanized coating in this system, and which also does not enable any local incoming or return flow.

It was further attempted to achieve high and vector-directed flow speeds by means of introducing gas into the process chamber by means of high flow speeds within a liquid column, by means of a lamella plate moving in front of the substrate, or by means of the nozzle gallows mounted in the process chamber. The current density distribution on the substrate surface has thus far been influenced by field baffles and/or separately controllable anode segments. However, the devices stated above have the disadvantage that no combined distribution of liquid flow and electric current flow is possible on locally limited surface elements of the substrate surface.

The object of the present invention is therefore to develop a device and a method, which avoid the stated disadvantages, by means of which therefore a homogenous liquid flow may be achieved on all reacting surface elements of the substrate surface, and simultaneously a targeted distribution of an electric field between the substrate and a counter electrode.

This task is solved according to the invention by a device according to the characteristics of claim 1, and by a method according to the characteristics of claim 7. Advantageous further developments are described in the dependent claims.

A device according to the invention for producing targeted flow and current density patterns with a chemical and/or electrolytic surface treatment comprises a flow distributor body that is submerged in a fluidic process solution. Opposite of the flow distributor body is a substrate that is attached in a suitable mount, the surface of which is wetted by the process solution, and in case of an electrolytic treatment, an electrode body is present, which is preferably located on a side of the flow distributor body opposite of the substrate, and which is also bathed in the process solution.

The flow distributor body as a front face and a rear face positioned opposite of the front face, wherein the front face faces the substrate during the surface treatment, and the distance between the front face and the substrate surface to be processed is as constant as possible across the entire surface. For this purpose, the distance may be a few millimeters to a few centimeters. Furthermore, this body has at least one inlet opening for the process solution, and at least one liquid passage ending at the front face in at least one outlet opening or nozzle. The pumped process solution flows through this at least one outlet opening at a relatively high speed in the direction of the substrate, and carries out the desired reaction at that location.

For discharging the process solution on the rear face of the flow distributor body, at least one connecting passage, preferably multiple connecting passages, are provided, which guide the process liquid from the front face to the rear face of the body, and thus enable a cycle of the process solution, in that the solution may be re-pumped from here into the inlet opening.

The planar distribution of the at least one outlet opening may approximately correspond to a distribution of surface elements reacting on the substrate, which define a structure to be displayed such that, for example, an outlet opening is in approximate alignment with a surface element. The term "approximately" shall comprise both a deviation of the position of the surface element of the structure to be displayed from the position of the outlet opening by up to a diameter, or a width of the outlet opening, which is also called a lateral offset, and a deviation of a size of the outlet opening from a size of the surface element forming structure to be displayed. In the latter case the outlet opening may be up to one order of magnitude larger than the corresponding, approximately aligned surface element. The term "approximately" shall also comprise an arrangement of multiple adjacent outlet openings in a grid that is narrowed as opposed to the arrangement of the remaining outlet openings, in order to flow to a corresponding, larger surface element of the substrate that is approximately in alignment with these outlet openings. With the selected arrangement it is therefore ensured that with an adequately high flow speed, a homogenous incoming flow of the regions to be processed is achieved.

In an advantageous manner the arrangement of the connecting passage approximately corresponds with the structure to be displayed on the substrate such that in a particularly preferred manner the connecting passages are adjacent to the outlet openings in a multitude of such passages. This arrangement brings about a direct backflow of the process solution after the chemical or electrolytical reaction, and simultaneously a targeted guidance of the electric field on the reacting surface regions. For this purpose the term "approximately" shall be defined for the connecting passage as above with reference to the outlet opening.

The substrate may be an essentially plate-shaped workpiece for the production of electric or electronic components, which is mechanically fixed in a mount, and the surface of which to be treated is bathed in the process liquid as the treatment medium coming from the flow distributor body. In a special case, the substrate may be a masked or unmasked conductor plate, a semi-conductor substrate, or a film substrate, or even any metal or metallized workpiece having an approximately planar surface. An approximately planar surface shall be defined herein such that a height difference between elevations and recesses of the substrate surface of the plate-shaped substrate are as large as the distance between the substrate and the flow distributor body, at a maximum.

The flow distributor body is advantageously embodied in multiple pieces, preferably in two pieces. In this manner individual components of the flow distributor body may be simply exchanged such that different incoming or outgoing flows may be adjusted.

A convection chamber positioned between the front face of the flow distributor body and the substrate surface is laterally limited in an advantageous manner by means of a plastic wall in order to force a targeted back flow of the process solution through the flow distributor body, and to bundle the effect of an electric field optionally applied in the convection chamber.

An advantageous further development provides that in case of an electrochemical surface treatment a space positioned between the rear face of the flow distributor body and the counter electrode, being filled with the process liquid, is also laterally limited by a further plastic wall in order to homogenize the electric field already before the passage through the connecting passages.

The outlet openings may be produced in the front face by means of bores, and have a diameter, or a width, respectively, in the sub-millimeter range up to the millimeter range, preferably of 0.05 mm to 10 mm. As an alternative to pure bore holes the outlet openings may also comprise separately produced nozzles, which are screwed or inserted into the material of the front face.

The connecting passages may have a round, square, or rectangular cross-section, and may be larger than the outlet openings with regard to their diameter, or their width. In this manner it is to be achieved that the process solution impinges on the substrate surface at a high speed in a targeted manner, and there causes a high material transport in the surface areas to be processed, while a lower flow speed is prevalent in the connecting passages due to the larger diameter. In particular, the pressure prevalent in the connecting passages is also much lower. In borderline cases, the width of a connecting passage may be at an order of magnitude of the substrate dimension. It may also be provided that multiple connecting passages exist at different diameters or widths, wherein in a particularly advantageous manner the diameter, or the width, respectively, on the average is larger than the diameter or the width of the outlet opening.

The flow distributor body may advantageously consist of plastic, in particularly advantageous manner of polypropylene, polyvinyl chloride, polyethylene, acrylic glass, i.e. polymethyl methacrylate, polytetrafluoroethylene, or another material that will not be decomposed by the process solution.

Another advantageous further development provides that the inlet opening is located outside of an incoming and/or outgoing flow zone. With such a spatial separation, there will be no, or only a slight influencing of the incoming process liquid with the incoming or back flow. In this manner any turbulence is also avoided, which would reduce flow distributor speeds, and furthermore in case of an electric field applied, a partial separation of the electric field will be avoided, which is caused by the connecting passages.

A counter electrode body is advantageously attached in the rear region of the flow distributor body, in mechanical contact with, or spatially separated from, the flow distributor body such that the electric current flow is carried out between the counter electrode and the substrate acting as the electrode within the process solution through the connecting passages. Depending on the surface treatment method used, the electrode body may consist of a material that is insoluble in the process liquid, such as platinized titanium, or otherwise a soluble material, such as for example, the metal to be galvanically separated. Electrode bodies of nearly any shape may be used in the device, which are common with electrolytic surface treatments, such as for example, closed plates, grate-like structures, or metal baskets filled with pellets.

The arrangement of the counter electrode body and of the substrate acting as an electrode on different sides of the flow distributor body has the advantage of enabling a homogenous field line distribution of an electric field caused by both of the above named electrode, corresponding to the arrangement of the surface areas reacting with the process solution. The field distribution is therefore also applied to the substrate surface to be treated in a homogenous manner. Finally, the flow distributor body may be positioned freely between the named electrodes such that the desired reaction on the parts of the substrate surface is substantially influenced by the incoming flow caused by the flow distributor body.

In one method according to the invention, a flow distributor body having the above mentioned properties, and a substrate to be processed are inserted into a process basin filled with the liquid process solution, and aligned such that the front face equipped with the outlet openings is positioned plane-parallel to the substrate surface. Smaller deviations from up to 5° are tolerable.

If the surface treatment is to be carried out with the aid of a voltage applied from the exterior, the substrate is connected to a first electrode such that the electrode and the substrate are positioned on the same potential. A counter electrode body with a polarity that is reversed toward the first electrode, is also incorporated into the process solution in this case, namely into the rear region of the flow distributor body.

The process solution is pumped into the inlet opening, or into multiple of the inlet openings, and exits from the outlet opening, or the outlet openings as an incoming flow at a high speed. Since the outlet openings advantageously have approximately the structure of the structure to be produced on the substrate, the desired reaction will occur particularly at those points of the substrate surface positioned opposite of the outlet openings. The process solution then flows through the connecting passages as a backflow onto the rear face of the flow distributor body, and may be pumped into the cycle in this manner. The flow distributor body and the substrate are thereby freely movable relative to each other such that the incoming flow onto the substrate may be simply and quickly changed by means of a change of the position of the flow distributor body.

In an advantageous further development of the method the flow distributor body and the substrate may carry out a parallel relative movement toward each other in order to avoid any static liquid flows on the substrate surface. For this purpose either only the flow distributor body, or only the substrate, but of course, also both may be moved in linear stroke-like, circular pivoting or oscillating movements. In this manner the incoming flow of the process liquid is supported by the additional movement, and the dynamics of the incoming flow is maintained by means of the permanent movement of the flow distributor body. Additionally, a relative movement along any desired axes is possible by means of the spatial separation of the substrate and the flow distributor body.

The method may come from the group of the electrolytic or chemical surface treatments, and may comprise, in particular, a galvanic coating, chemical or electrochemical etching, anodal oxidation, or another method of external currentless metal precipitation.

Exemplary embodiments of the invention are illustrated in the FIGS. 1 to 3, and are subsequently explained based on these figures.

Figure 2:
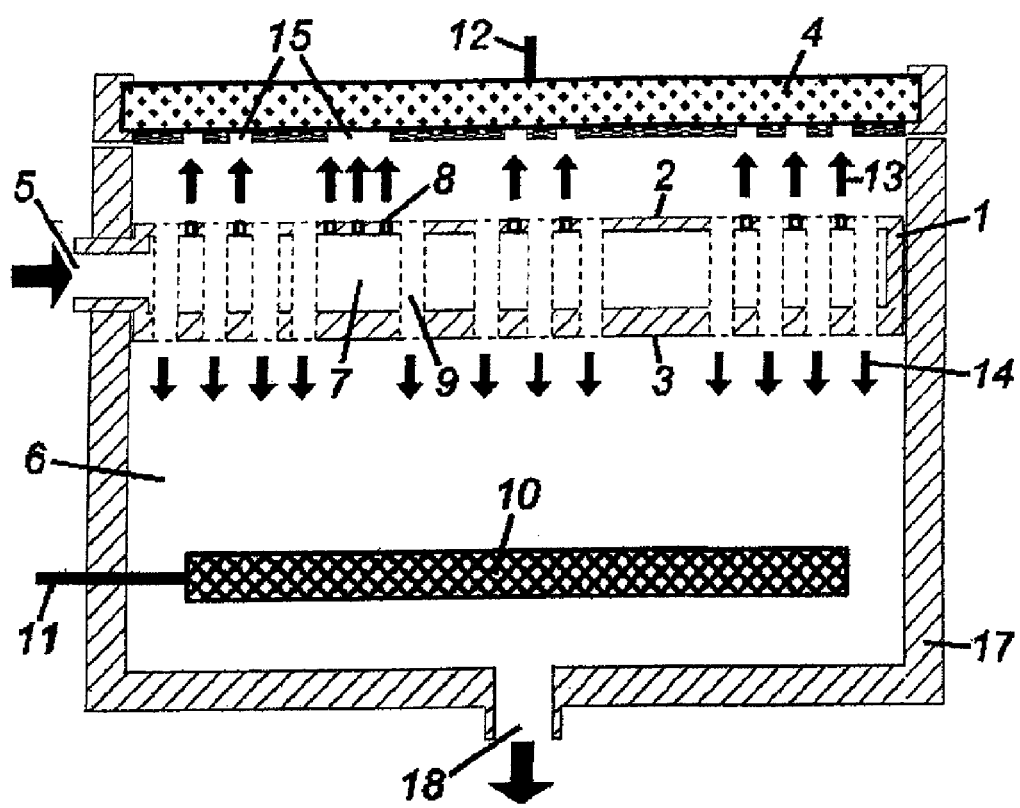
Figure 3:
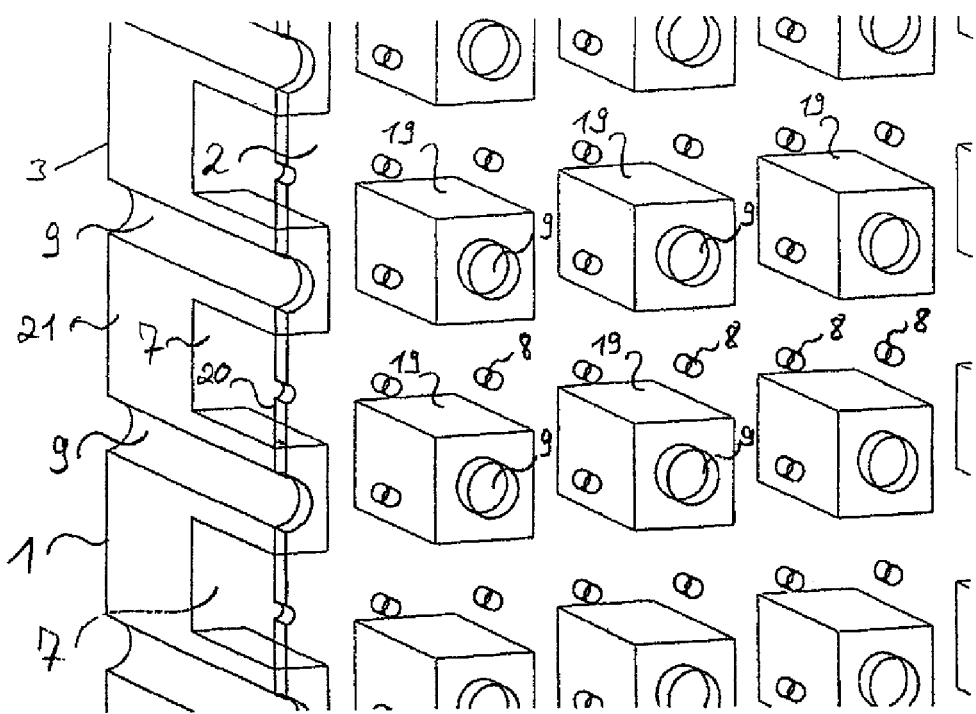

They show:

FIG. 1 a side view of a device according to the invention at a cross-section with vertical mount;

FIG. 2 a side view of a device according to the invention at a cross-section with horizontal mount, and FIG. 3 a partial perspective view of a two-part flow distributor body.

FIGS. 1 and 2 each show a side view at a cross-section of an exemplary embodiment of a device according to the invention. Any recurring characteristics are denoted by the same reference symbols in FIGS. 2 and 3. A flow distributor body 1 is submerged in a fluidic process solution 6, which may be aqueous or non-aqueous, in a process basin 17 made from plastic, such as polypropylene. In this process basin 17 there is also a substrate 4 having a conductive surface, which is connected to an electrode 12, as well as a counter electrode body 10, which is connected to a further electrode 11, the polarity of which is opposite of that of the electrode 12. The counter electrode body 10 is embodied as a plate, and has no through-holes. The counter electrode body 10, the substrate 4, and the flow distributor body 1 are spatially separated from each other, wherein a distance between the substrate 4 and the flow distributor body 1 is 20 mm, while the distance between the flow distributor body 1 and the counter electrode 10 is 40 mm. In the present case the substrate 4 is a metal substrate, however, in other exemplary embodiments a semi-conductor substrate, such as a wafer, or a conductor plate, may also be used. In order to apply a structure 15 on partial surfaces of the substrate 4, the substrate 4 was equipped with a suitable marking, which is not or only minutely aggravated by the process solution 6. In this context "minute" shall mean that although the masking, for example, a photoresist may be ablated by the process solution, this process progresses so slowly, however, that with common process durations a remainder of the masking remains on the substrate 4.

The further electrode 11 is embodied as an anode, while the electrode 12 functions as a cathode. Of course, in other embodiments the further electrode 11 may also represent the cathode, if the electrode 12 is the anode. In the exemplary embodiment illustrated, metal is precipitated on the substrate 4 by means of a galvanic reaction. An electrolytic liquid is used as the process liquid 6. The electric field generated by the two electrodes 11, 12 by means of the arrangement of the counter electrode body 10 and the substrate 3, always extends through the flow distributor body 1. By means of a suitable positioning of the flow distributor body 1 with regard to the counter electrode body 10 and the substrate 4, regions of the substrate 4 may therefore be applied with a particularly strong incoming flow 13, and also with the electric field such that a reaction occurs at these locations.

The flow distributor body 1 has a front face 2, which is aligned as plane-parallel to the substrate 4 as possible. However, smaller deviations of the parallelism up to about 5° may be tolerated.

A rear face 3 is positioned opposite of the front face 2. A hollow space, the liquid passage 7, is present between the front face and the rear face, which may be filled with the process solution 6. For this purpose an inlet opening 5 is located in a lateral area of the flow distributor body 1 located between the front face 2 and the rear face 1, which is equipped with a thread for the connection to the casing of the pump cycle. The flow distributor body 1 itself is made from polypropylene.

The convection chamber formed by the front face 2 and the surface of the substrate 4 is further limited by means of the walls of the process basin 17 and a further wall 16, which forces a targeted backflow 14 through the connecting passages 9, and simultaneously influences the field line distribution favorably. In the exemplary embodiment shown, these walls are also made of polypropylene. Just as the further wall 16 is arranged between the substrate 4 and the front face 2, such wall may, of course, also be arranged between the rear face 3 and the counter electrode body 10. In the example shown, the further wall 16, like the process basin 17, is made of a plastic, such as polypropylene.

Bore holes with a diameter of 1 mm are contained in the flow distributor body 1, which end in outlet openings 8 of the liquid passage 7, each with an identical diameter at the front face 2. In addition to cylindrical shapes, the bore holes may also have a conical shape. The distribution of the outlet openings 8 approximately corresponds with the structure 15 to be produced on the substrate 4, i.e. the outlet openings 8 are in alignment with those partial surfaces of the substrate 4, on which the structure 15 is to be displayed. In this manner the incoming flow 13 coming from the outlet openings 8 impinges directly upon those partial surfaces of the substrate 4, which are to participate in the electrochemical reaction. The outlet openings 8 are round, but may also be embodied in an elliptical or rectangular shape, or in other geometric shape, as long as an adequate flow speed may be reached. The outlet openings 8 may also be significantly larger in a spatial dimension than in another such that, for example, a line-shaped or column-shaped geometry is achieved, wherein the lines or columns may extend across the entire length, or width, respectively, of the flow distributor body 1.

The process solution 6 exits the hollow space positioned between the front face 2 and the rear face 3 through the outlet openings 8 at a high flow speed, and forms an incoming flow 13 directed toward the substrate 4. The metal coating occurs in the local surface areas as the structure 15 to be applied, and the direction of the flow reverses at that point. Due to the now less strongly directed flow, the flow speed is reduced, the backflow 14 formed is guided to the rear face 3 of the flow distributor body 1 through the connecting passages 9. The connecting passages 9 are located adjacent to the outlet openings 8, and thereby form the structure 15 to be produced on the substrate 4, also approximately by about 2 mm as opposed to the surfaces of the structure 15, in an offset manner. In the exemplary embodiment shown the connecting passages 9 are individual tubes that were used in the corresponding openings of the flow distributor body 1.

The connecting passages 9 have a diameter of 5 mm. Due to the different size relations of the connecting passages 9 and the outlet openings 8, the liquid pressure and the flow speed are much lower in the connecting passages 9. The process solution 6, having reached the rear face 3 of the flow distributor body 1, is re-pumped into the inlet opening 5 by means of a drain 18 of the process basin 17 and a pump (not illustrated).

In order to avoid any rigid flow vectors, and instead achieving a convection of the reacting surface areas of the substrate 4 that are as even as possible, the flow distributor body 1 and the substrate 4 are in a relative movement parallel to each other from up to 1 mm in both directions, wherein in the present case both bodies are moved parallel to the incoming flow 13, or the backflow 14, respectively.

FIG. 1 shows a vertical mount of the flow distributor body 1 and the substrate 4, while FIG. 2 shows a horizontal arrangement. In the horizontal arrangement the front face 2 of the flow distributor body 1 is also positioned opposite of the substrate 4. A counter electrode body 10 faces the rear face 3 of the flow distributor body 1. The substrate 4 covers the process basin 17 in the manner of a lid, and thus prevents any escape of the process liquid 6 from the process basin 17. The inlet opening 5 of the flow distributor body 1 is incorporated in an opening of the process basin 17, and is connected to the same in a mechanically stable manner. Due to the incoming flow 13 against gravity, the backflow 14 is facilitated in the exemplary embodiment illustrated in FIG. 2, since the same is supported by gravity. The substrate 4 is freely movable with regard to the flow distributor body 1, as shown in the exemplary embodiment in FIG. 1, such that field line courses may be freely adjusted between the counter electrode body 10 and the substrate 4 by means of displacing or twisting.

Of course, a mount tilted about an angle opposite of the walls of the process basin 17 may also be provided. The front face 2 and the rear face 3 of the flow distributor body 1 do not mandatorily, as shown in FIG. 1 and FIG. 2, have to be bonded to each other. In a further exemplary embodiment, which is not illustrated here, two plates having corresponding openings may also be used as the front face 2 and the rear face 3, which are positioned relative to each other, and are held in this position by means of clamps or screws.

In a further exemplary embodiment illustrated in FIG. 3, the inlet opening 5, the liquid passages 7, and the connecting passages 9 may also be etched in a solid material block 21, such as one of polyvinyl chloride. This figure shows in a perspective view part of a two-part flow distributor body 1. The etched solid material block 21 forms the rear face 3 of the flow distributor body 1, and comprises ashlar-shaped bars 19 facing away from the rear face 3, and created by means of etching, which are arranged periodically at a distance of 2 mm, and each have in their centers one connecting passage 9 extending through the bars 19. Liquid passages 7 are positioned between the bars 19.

An additional plate 20 forms the front face 2. This additional plate 20 is arranged on the etched solid material block 21 in a positive fit, and attached to the same by means of, for example, a screw or clamping connection, respectively. For this purpose the additional plate 20 rests on a square surface of the bars 19 positioned parallel to the rear face 3. In a selected illustration of FIG. 3, the additional plate 20 consists of polymethyl methacrylate, and is transparent. The additional plate 20 also has openings for the connecting passages 9, which have been brought into alignment with the connecting passages 9 of the etched solid material block 21. Furthermore, the additional plate 20 has outlet openings 8, the diameter of which is smaller at 0.2 mm than the diameter of the connecting passages 9 at 0.6 mm, which however, are also periodically arranged on the additional plate 20 at a distance of 1 mm.

The left side of the two-part flow distributor body 1, consisting of an additional plate 20 and an etched solid material body 21, is shown in a cross-sectional view in order to illustrate that the connecting passages 9 extend completely through the bars 19.

The process liquid 6 is poured into the liquid passage 7 positioned between the additional plate 20 and the etched solid material block 21, which has the height of the bars 19, through one or more inlet openings (not illustrated in FIG. 3), which may exit the flow distributor body 1 on the front face 2 as the incoming flow 13 only through the outlet openings 8, and which is returned to the rear face 3 as a backflow 14 through the connecting passages 9 from the front face 2. In order to give the incoming flow 13 a different geometry, the additional plate 20 may be exchanged with a different plate, in which the openings for the connecting passages 9 are shown in the same positions as those in FIG. 3, however, in which the outlet openings 8 have a different position.

Only the characteristics of the different embodiments disclosed in the exemplary embodiments may be claimed either combined with each other, or individually.

The invention claimed is:

1. A device for creating targeted flow and current density patterns in a chemical and/or electrolytic surface treatment of a substrate in a fluidic process solution, the device comprising:
   a flow distributor body having a front face facing the substrate during the surface treatment, wherein the front face has dimensions at least as big as dimensions of the surface of the substrate to be treated, and
   a rear face opposite of the front face,
   wherein the flow distributor body comprises at least one inlet opening for the process solution, and at least one liquid passage,
   wherein the at least one liquid passage has at least one outlet opening at the front face for creating an incoming flow on the substrate,
   and wherein the flow distributor body has at least one connecting passage for receiving a backflow from the substrate, wherein the at least one connecting passage extends from the front face to the rear face, wherein the at least one connecting passage has a larger diameter, or a larger width, respectively, than the at least one outlet opening.

2. The device according to claim 1, wherein the arrangement of the at least one outlet opening on the front face corresponds approximately to a structure to be located on the substrate.

3. The device according to claim 1, wherein the arrangement of the at least one connecting passage on the front face corresponds approximately to the structure to be located on the substrate.

4. The device according to claim 1, wherein the at least one outlet opening has a diameter, or a width, respectively, of between 0.05 mm and 10 mm.

5. The device according to claim 1, wherein the diameter, or the width, respectively, of the connecting passage provides a dimension up to the substrate size.

6. The device according to claim 1, wherein the inlet opening is located outside of an incoming flow zone and/or backflow zone.

7. A method for creating targeted flow and current density patterns in a chemical and/or electrolytic surface treatment of a substrate in a fluidic process solution, the method comprising:

- inserting a flow distributor body with at least one liquid passage into the fluidic process solution, wherein the front face has dimensions at least as big as dimensions of the surface of the substrate to be treated;
- aligning the flow distributor body such that its front face is positioned plane-parallel to the substrate to be treated; and
- pumping the process solution through at least one inlet opening such that the process solution impinges upon the substrate as an incoming flow through the at least one outlet opening, and flows off as a backflow through at least one connecting passage, the at least one connecting passage has a larger diameter, or a larger width, respectively, than the at least one outlet opening.

8. The method according to claim 7 wherein the substrate is connected to a first electrode, wherein a counter electrode body is in the process solution, wherein the counter electrode body is connected to a second electrode having a polarity that is reverse to that of the first electrode.

9. The method according to claim 7, wherein the flow distributor body, and/or the substrate perform a relative movement directed parallel to each other during the pumping of the process solution.

10. The method according to claim 7, wherein the substrate comprises a conductor plate, a semi-conductor substrate, a film substrate, or an essentially plate-shaped, metal or metallized workpiece, and that the surface to be treated is masked or unmasked.

11. The method according to claim 7, wherein a galvanized coating, chemical or electrochemical etching, anodal oxidation, or another method of the external currentless metal separation is performed.

* * * * *